(12) United States Patent
Yang

(10) Patent No.: US 8,130,365 B2
(45) Date of Patent: Mar. 6, 2012

(54) IMMERSION FLOW FIELD MAINTENANCE SYSTEM FOR AN IMMERSION LITHOGRAPHY MACHINE

(75) Inventor: Zhiyong Yang, Shanghai (CN)

(73) Assignee: Shanghai Micro Electronics Equipment Co., Ltd., Shanghai (CN)

( * ) Notice: Subject to any disclaimer, the term of this patent is extended or adjusted under 35 U.S.C. 154(b) by 697 days.

(21) Appl. No.: 12/304,189

(22) PCT Filed: Dec. 25, 2006

(86) PCT No.: PCT/CN2006/003592
§ 371 (c)(1),
(2), (4) Date: Dec. 10, 2008

(87) PCT Pub. No.: WO2007/147304
PCT Pub. Date: Dec. 27, 2007

(65) Prior Publication Data
US 2009/0273765 A1 Nov. 5, 2009

(30) Foreign Application Priority Data

Jun. 13, 2006 (CN) .......................... 2006 1 0027707

(51) Int. Cl.
*G03B 27/42* (2006.01)
*G03B 27/52* (2006.01)
*G03B 27/58* (2006.01)
(52) U.S. Cl. ............................. 355/72; 355/30; 355/53
(58) Field of Classification Search ............... 250/492.2; 310/12.01, 12.05, 12.06, 12.09; 355/30, 355/53, 72, 75, 77
See application file for complete search history.

(56) References Cited

U.S. PATENT DOCUMENTS

| 5,610,683 | A | 3/1997 | Takahashi et al. |
| 6,879,378 | B2* | 4/2005 | Morita et al. .................... 355/53 |
| 2004/0211920 | A1 | 10/2004 | Maria Derksen et al. |
| 2005/0036121 | A1 | 2/2005 | Hoogendam et al. |
| 2005/0117134 | A1* | 6/2005 | Nagasaka et al. ............... 355/30 |
| 2006/0023186 | A1 | 2/2006 | Binnard |
| 2006/0082741 | A1* | 4/2006 | Van Der Toorn et al. ....... 355/30 |
| 2006/0187431 | A1* | 8/2006 | Shibazaki ......................... 355/53 |
| 2006/0227308 | A1* | 10/2006 | Brink et al. ..................... 355/53 |
| 2007/0127006 | A1* | 6/2007 | Shibazaki ........................ 355/72 |

FOREIGN PATENT DOCUMENTS

CN 2742470 11/2005
(Continued)

*Primary Examiner* — Hung Henry Nguyen
*Assistant Examiner* — Colin Kreutzer
(74) *Attorney, Agent, or Firm* — Rabin & Berdo, P.C.

(57) ABSTRACT

An immersion flow field maintenance system for an immersion lithography machine. The machine includes a projection objective lens, a wafer stage for supporting the wafer, and an immersion supplying system distributed around the lens for producing an immersion flow field under the lens. The system includes a horizontal guideway, a flat board connected with the horizontal guideway through a cantilever, and drivers for moving the board. When the wafer is unloading and the wafer stage is moving out of the exposure area under the lens, the board connects to and moves synchronously with the wafer stage to transfer the flow field from above the wafer stage to above the board. When the wafer is loaded and the wafer stage is moving into the exposure area, the board connects to and moves synchronously with the wafer stage to transfer the flow field from above the board to above the wafer stage.

9 Claims, 10 Drawing Sheets

FOREIGN PATENT DOCUMENTS

| | | |
|---|---|---|
| CN | 1740916 | 3/2006 |
| JP | 2004-259966 | 9/2004 |
| JP | 2005-026634 | 1/2005 |
| JP | 2006-080281 | 3/2006 |
| WO | WO-2004/090577 A2 | 10/2004 |
| WO | WO 2005074014 A1 * | 8/2005 |

* cited by examiner

IMMERSION FLOW FIELD MAINTENANCE SYSTEM FOR AN IMMERSION LITHOGRAPHY MACHINE

TECHNICAL FIELD

The present invention relates to the immersion lithography machine used in the semiconductor process, particularly to an immersion flow field maintenance system for an immersion lithography machine.

BACKGROUND ART

The lithography machine is the most important central device in integrated circuit manufacturing. Recently immersion lithography becomes the developing trend of lithography technology in integrated circuit manufacturing. The theory of immersion lithography is to fill the area between the wafer and the last glass of the projection objective lens with high refractive index liquid in order to gain larger numerical aperture, and therefore gain higher exposal resolution.

As illustrated in FIG. 1, it discloses the structure of the present lithography machine. In the lithography machine, the main framework 0 supports an illumination system 20, a projection objective lens 10 and a wafer stage 40. The wafer 50 covered with photoresist is positioned on the wafer stage 40. Through the illumination system 20 and the projection objective lens 10, the pattern of integrated circuit is transferred onto the wafer covered with photoresist 50 by means of image exposure, and thereby the exposure process is finished.

The resolution of the exposal pattern is determined by the performance of the lithography machine, while the performance of integrated circuit is determined by the resolution of the exposal pattern. The most important factors which determine the resolution of the exposal pattern are wavelength of the lamp-house, numerical aperture of the projection objective lens and process factor. Increasing numerical aperture can achieve higher resolution under the prerequisite of determined wavelength of the exposal lamp-house. The value of numerical aperture of the projection objective lens is calculated by multiplying the refractive index of image space by the sine value of the angular aperture. FIG. 2 is a schematic view of a sort of immersion exposure technology. As illustrated in FIG. 2, the immersion exposure can increase the resolution through increasing numerical aperture by using a medium of high refractive ratio at the image side. The similar application is popular in the oil immersion microscope, but because of the complexity of the technical conditions, the application of immersion technology in the lithography machine meets many practical difficulties. The first question that must be resolved is to choose the image side medium, for which the optical characteristics in the deep ultraviolet wave band, the interaction with the photoresist, the viscosity, clean ability and damage to the main structure of the lithography machine must be considered. At present ultra-high purity water is the commonest packing medium.

The second question that must be resolved is to maintain the medium in the image field of the lithography machine. Since the area between the projection objective lens 1 and the wafer 5 is an open area, when the lithography machine works, the wafer stage 4 drives the wafer 5 scanning at high speed and carrying out step action, thus the immersion system must provide stable medium condition in the scope of the projection objective lens field of view according to the movement state of the wafer stage 4, and at the same time it must keep the medium waterproof to prevent the liquid from leaking out. Generally, immersion condition is a stable flow field, its velocity and direction of flow is fit for movement of the wafer stage and it also can clean and heat sink.

As to the recently developed dual wafer stages technology, it has two wafer stages working simultaneously in one lithography machine (one wafer stage carries out the scan and exposure steps under the projection objective lens, the other wafer stage carries out wafer loading/unloading, alignment and wafer topography detection. The two wafer stages switch their positions when finishing their corresponding work). Therefore, keeping the immersion lithography machine stable is very important to a dual wafer stage lithography machine.

The work flow of the immersion system can be divided into establishing the immersion environment, removing the immersion environment, and normal exposure. These processes need to cooperate with the whole work flow of the lithography machine. The lithography machine needs to carry out loading or unloading process of the wafer, off axis measuring process and exchanging process of the wafer stages besides the exposure process. All the processes must be carried out under an immersion environment. When the wafer stage is not under the projection objective lens, several problems such as how the status of the immersion system is, whether the flow field needs to be removed must be considered. Removing and establishing the flow field are respectively the processes of emptying the liquid in the immersion environment and filling liquid into the immersion environment from an empty state. These processes cost much time, and the establishment of the flow field on the wafer may greatly concuss the photoresist, which are the cases that the designer wants to avoid. At present, the method used in the semiconductor field, such as the one described in US patent 2005/0036121 A1, changes the maintenance state of the flow field to some extent when the wafer stages are exchanging, adding additional actions and corresponding devices to the wafer stages and the immersion system, complicating the structure of the system.

SUMMARY OF INVENTION

It is therefore an object of the present invention to provide an immersion flow field maintenance system for an immersion lithography machine, which can maintain immersion condition and the flow field working state, and eliminate the repeated removing and establishing flow field processes, thus saving time and increasing the throughput of the lithography machine.

In order to achieve the aforementioned object, the present invention provides an immersion flow field maintenance system for the immersion lithography machine, wherein, the lithography machine includes a projection objective lens, at least a wafer stage for supporting the wafer, and an immersion supplying system distributed around the projection objective lens for producing an immersion flow field under the projection objective lens. The immersion maintenance system includes a horizontal guideway, a flat board connected with the horizontal guideway through a cantilever, horizontal drivers attached to the horizontal guideway driving the flat board to move in the horizontal direction, and vertical drivers attached to the cantilever driving the flat board to move in the vertical direction. When the wafer is unloading and the wafer stage is moving out of the exposure area under the projection objective lens, the flat board connects to and moves synchronously with the wafer stage to transfer the immersion flow field from above the wafer stage to above the flat board driven by horizontal drivers; when the wafer is loaded and the wafer stage is moving into the exposure area, the flat board connects to and moves synchronously with the wafer stage to transfer the immersion flow field from above the flat board to above the wafer stage driven by horizontal drivers.

The immersion flow field can be established on the flat board without supporting by the wafer stage.

In the abovementioned immersion maintenance system, when the lithography machine carries out exposure, the flat board is moved to the periphery of the projection objective lens driven by horizontal drivers and is raised over the wafer stage driven by vertical drivers.

In order to decrease the influence that the movement of the flat board affects on the flow field, the flat board surface has the same hydrophobic character as the wafer surface.

The flat board can be connected to the wafer stage via waterproof connectors, when the wafer stage and the flat board approach each other, it can produce an interattraction force for connecting the flat board and the wafer stage. A clamping device is mounted on the edge of the wafer stage for clamping and waterproofing the wafer stage and the flat board after they connect with each other.

The horizontal guideway includes two parallel linear bearings, and the cantilever includes plural symmetrically positioned vertical cantilevers extended from opposite sides of the flat board. Cantilevers of each side are connected to the horizontal guideway of the corresponding side. This side supporting method for the flat board utilizes the space around the projection objective lens, and prevents the framework from conflicting with the wafer stage or the projection objective lens.

Horizontal and vertical drivers can drive the flat board when the flat board moves independently. When the flat board and the wafer stage connect with each other, the flat board is driven by the wafer stage and the drivers of the flat board are under an idle state.

The present invention is applicable for both the single wafer stage lithography machine and the dual wafer stage lithography machine. When applied to a dual wafer stage lithography machine, the immersion flow field maintenance system of the present invention uses a flat board to respectively connect to the two wafer stages, so that the flow field can be switched between the two wafer stages, wherein, the direction of one wafer stage entering the immersion flow field is the same as the direction of the other wafer stage leaving the immersion flow field.

Compared with prior art, the present invention provides a bran-new solution referring to immersion lithography machines. The system of the present invention eliminates the removing and establishing processes of the flow field when the wafer stage leaves and enters the exposal position, thus saving much time and improving the throughput of the lithography machine.

DETAILED DESCRIPTION OF PREFERRED EMBODIMENTS

The immersion flow field maintenance system of the immersion lithography machine of the present invention is applicable to a dual wafer stage lithography machine as well as a single wafer stage lithography machine. The present invention will be described in detail as follows by reference to a preferred embodiment of a dual wafer stage structure.

Figure 1:
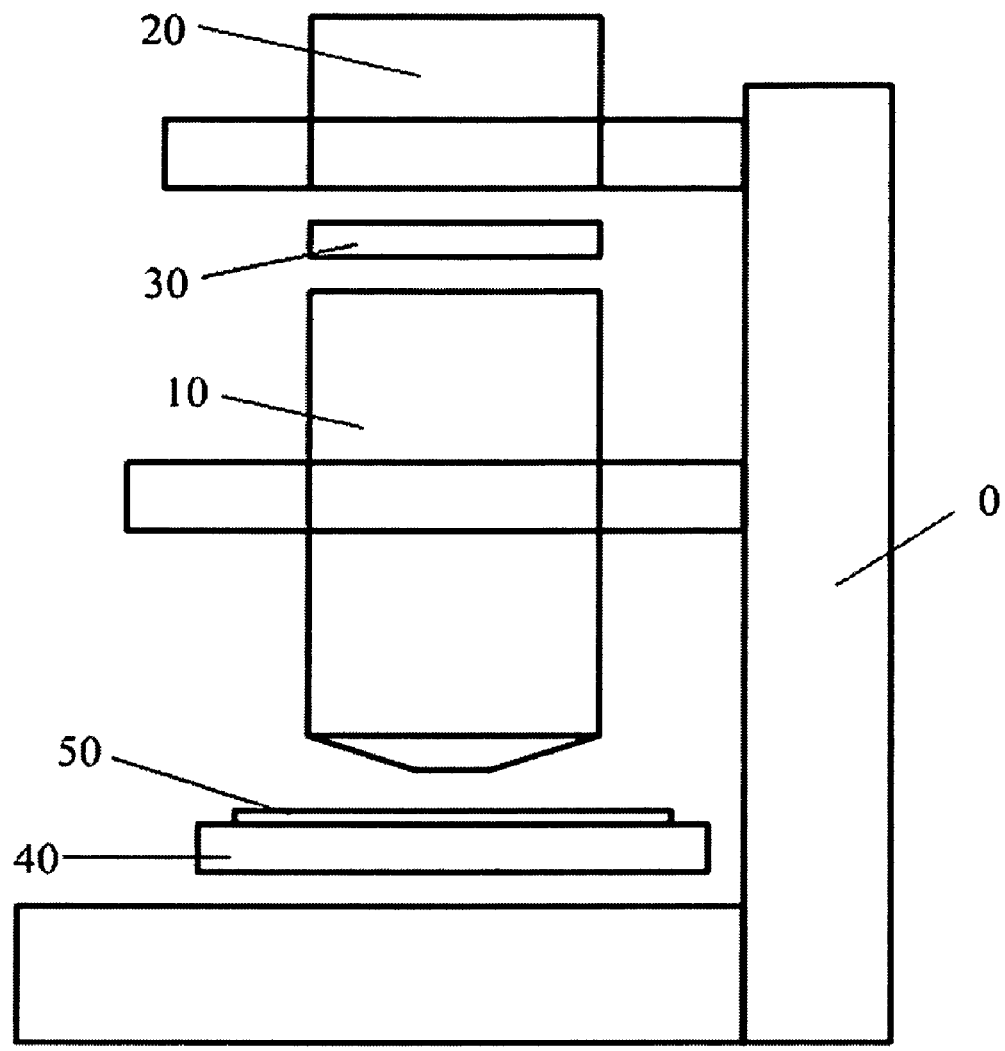
FIG. 1 is a schematic structural view of a conventional lithography machine.
Figure 2:
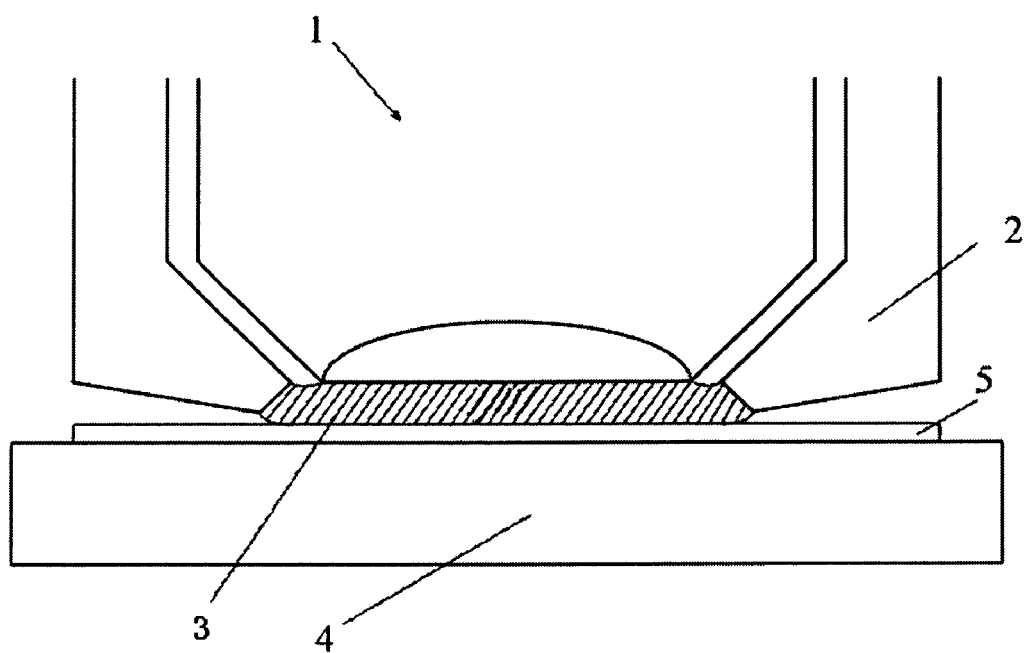
FIG. 2 is a schematic view of the present immersion exposure technology.
Figure 3:
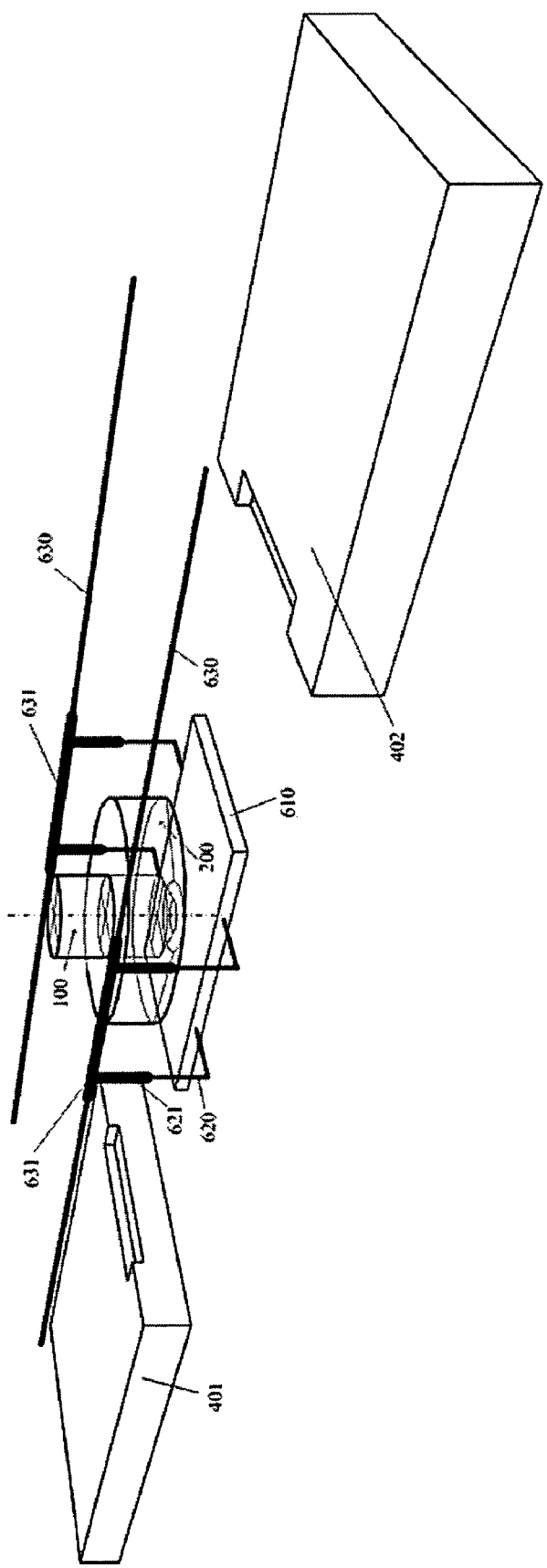
FIG. 3 is a schematic structural view of the immersion flow field maintenance system cooperating with the dual wafer stages of the present invention.

Please refer to FIG. 3, FIG. 13, FIG. 14(a) and FIG. 14(b), among which, FIG. 3 shows the cooperation between the immersion flow field maintenance system and the projection objective lens 100, the wafer stage 401, 402, and the immersion supplying system 200 of the dual wafer stage lithography machine. Wherein, there is an exposure area between the wafer stage 401 and 402. The immersion supplying system 200 is distributed around the projection objective lens 100. The immersion flow field maintenance system includes a big enough flat board 610 for precise positioning under and around the projection objective lens 100. The flat board 610 is fixed in a suspensory way. Four cantilevers 620 extend from opposite sides of the flat board for supporting the flat board and for driving positioning. Cantilevers of either side are connected to the corresponding horizontal guideway 630. The side supporting and installation method utilizes the space around the projection objective lens 100, so that the supporting and driving structure (including the cantilever 620 and the horizontal guideway 630) will not conflict with the wafer stage 401, 402 and the projection objective lens 100.

The immersion flow field maintenance system further includes horizontal drivers 631 attached to the horizontal guideway 630, and vertical drivers 621 attached to the cantilever 620. The flat board 610 can move in the horizontal or vertical direction respectively driven by the horizontal drivers 631 or the vertical drivers 621. In order to decrease the influence of the movement of the flat board 610 on the flow field, the flat board 610 adopts a hydrophobic surface the same as the surface of the wafer. Sensors can be installed in the flat board 610 for imaging detection and exposure dose detection.

Before the wafer stages 401, 402 enter the exposure area; the flat board 610 of the immersion maintenance system is positioned in the central region under the projection objective lens 100. After the wafer stage 401 or 402 enters the exposure area, the flat board 610 is gradually moved out of the central region under the projection objective lens 100. Since the directions of the wafer stages 401 and 402 entering the exposure area are different, the flat board 610 of the flow field maintenance system will be moved in different directions to avoid the conflict. There are two positions of avoidance corresponding to the wafer stages 401 and 402 of the dual wafer stage lithography machine, each avoidance position being set according to the position the wafer stage entering the exposure area.

Figure 12A:
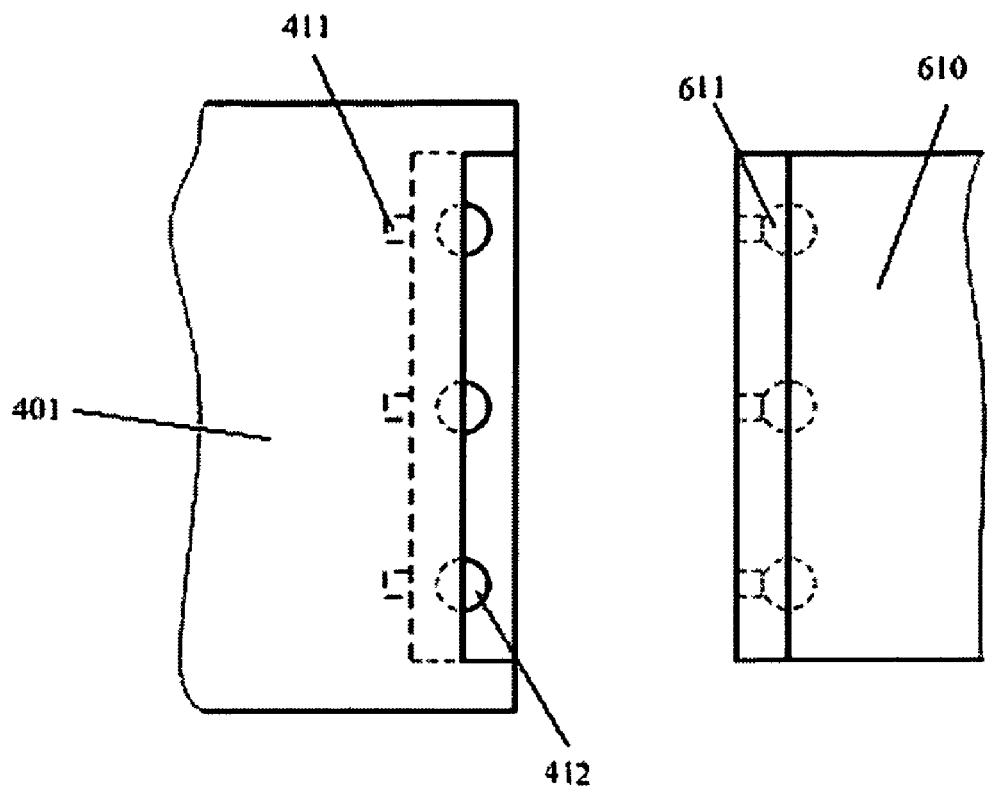
FIG. 12(a) is a top plan view of the connector between the flat board and the wafer stage of the present invention.
Figure 12B:
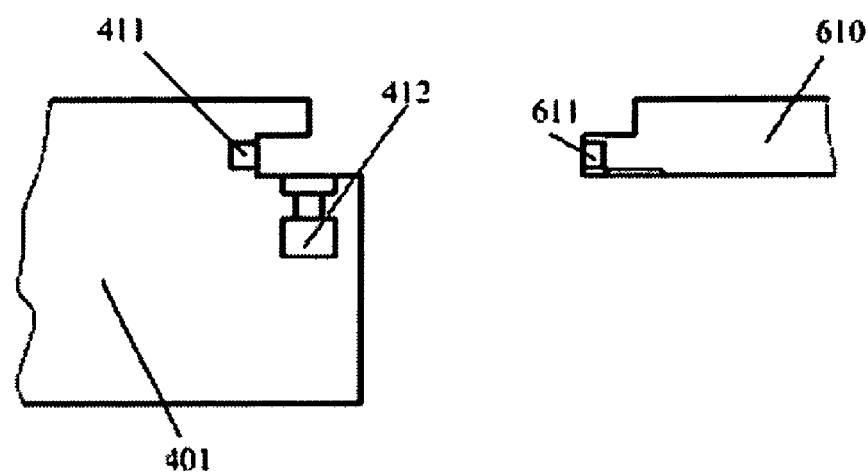
FIG. 12(b) is a schematic cutaway view of the connector between the flat board and the wafer stage of the present invention.
Figure 13:
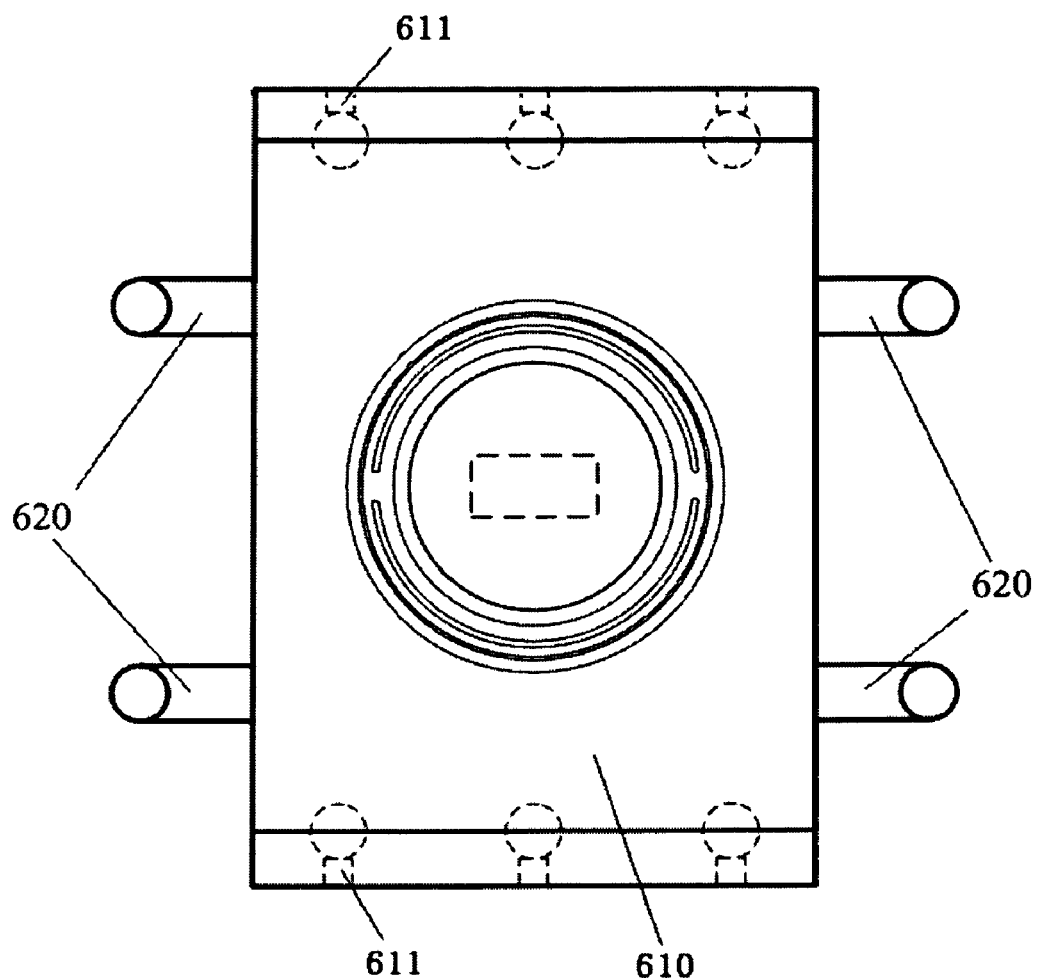
FIG. 13 is a partial schematic cutaway view of the immersion flow field maintenance system of the present invention, mainly illustrating the cantilever around the flat board and the connector.
Figure 14A:
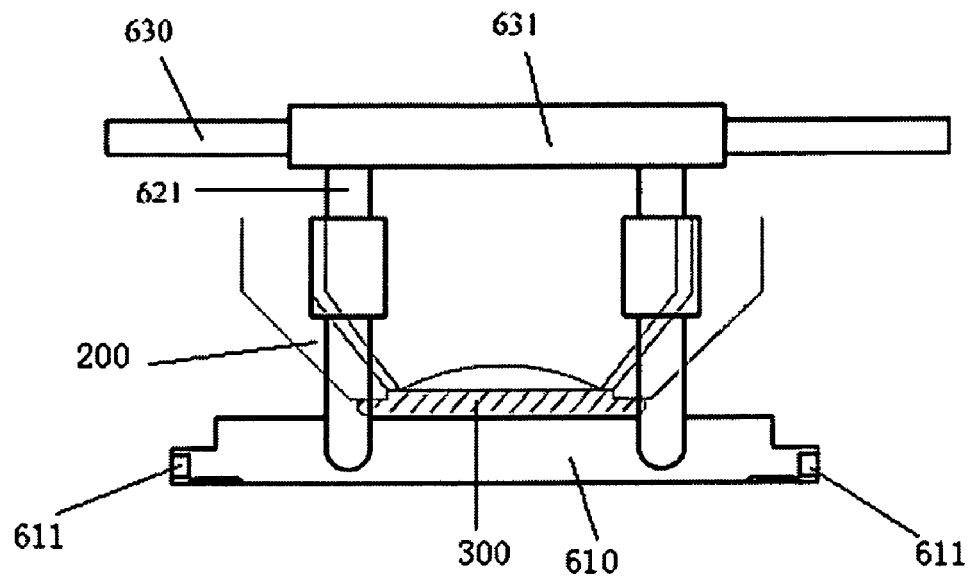
FIG. 14(a) is a side-glance view of the immersion flow field system from one side in FIG. 3 of the present invention.
Figure 14B:
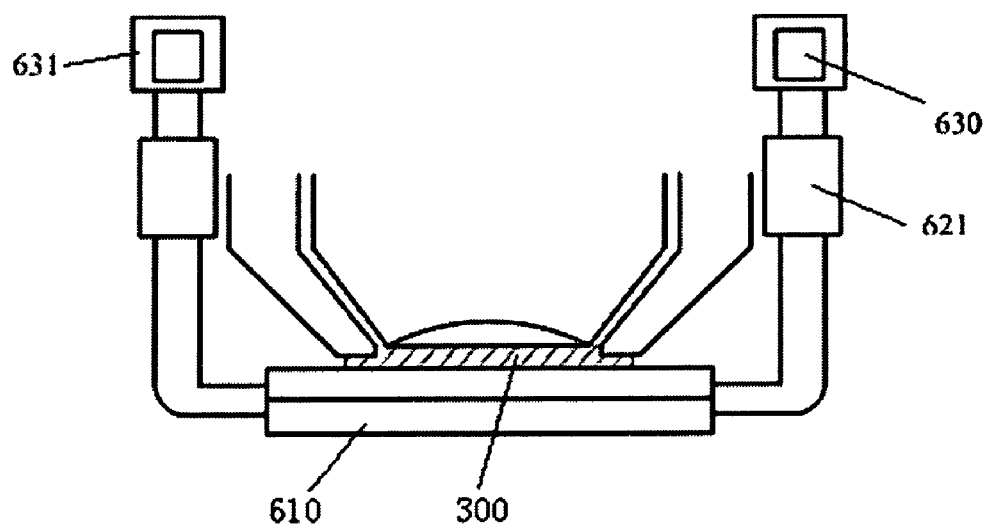
FIG. 14(b) is a side-glance view of the immersion flow field system from the other side in FIG. 3 of the present invention.

As illustrated in FIG. 12(a) and FIG. 12(b), interface device 411 and clamping device 412 are mounted on the wafer stage 401 (402) for connecting to and clamping the flat board 610. Waterproof connectors 611 corresponding to the interface device 411 are also mounted on both portions of the flat board 610. When the wafer stage and the flat board 610 approach each other, the interface device 411 and the connectors 611 generate a horizontal interattraction force for connecting the wafer stage 401 (402) with the flat board 610. The abovementioned interattraction force can be generated via vacuum chuck, electromagnet or other components. The interface 411 of the wafer stage 401 (402) has a hollow groove structure, while the edge of the flat board 610 has a protruding tenon structure, the hollow groove structure and the protruding tenon structure matching with each other. After the interface device 411 connect with the waterproof connectors 611, the clamping device 412 presses the underside of the protruding tenon structure on the edge of the flat board, so that waterproof connection can be achieved by the friction between the two structures, and liquid will not leak from the joint.

FIGS. 4 to 9 show the work flow of the immersion flow field maintenance system.

Figure 4:
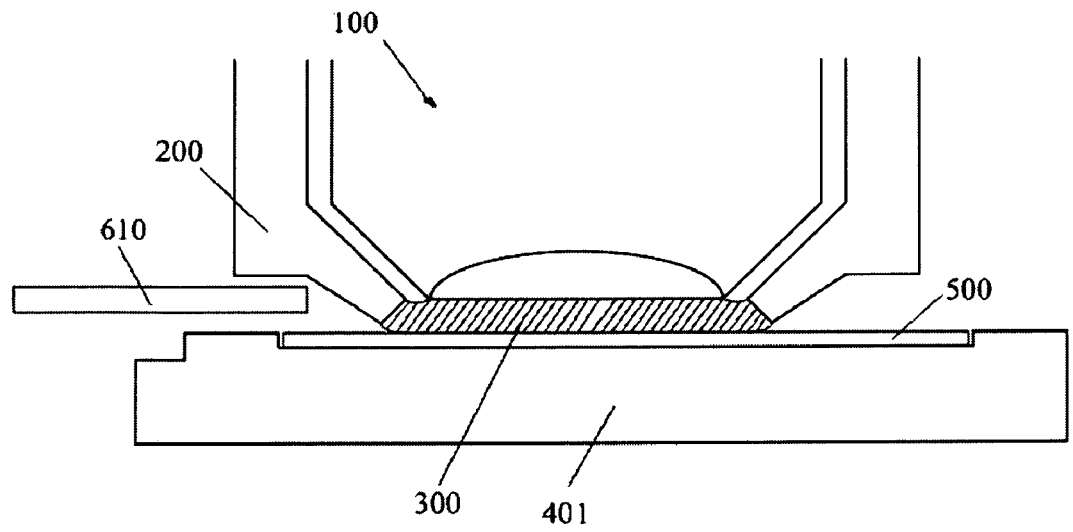
FIGS. 4 to 9 are schematic cutaway views of different states of the cooperative movement between the immersion flow field maintenance system and the wafer stage, mainly illustrating the change of position relations among the flat board, the wafer stage and the immersion liquid.

Firstly, as illustrated in FIG. 4, when exposure is carried out on the wafer stage 401, the immersion flow field maintenance system is under a stand-to state. The flat board 610 is located at the periphery of the projection objective lens 100 and right on the avoidance position above the wafer stage 401 for avoiding the conflict with the wafer stage 401 and the projection objective lens 100 under the exposure process. There is full of immersion liquid 300 between the wafer stage 401, the wafer 500 and the bottom surface of the projection objective lens 100. Immersion liquid 300 is waterproofed by immersion maintenance system to avoid leakage.

Figure 5:
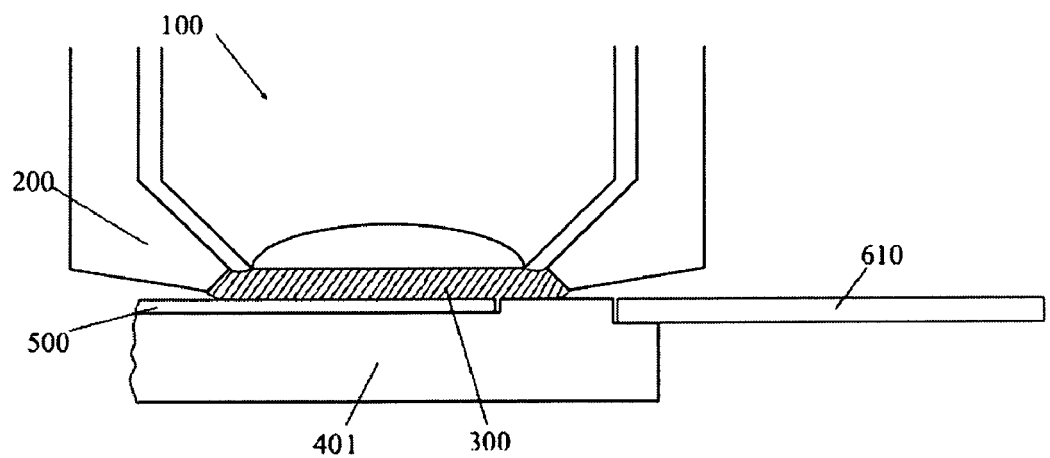

Next, as illustrated in FIG. 5, when the exposure process is finished and the wafer stage 401 is ready for remove, the wafer stage 401 is moved to a predetermined position to empty out the space under the flat board 610. Then, the flat board 610 is descended and moved horizontally to connect with the wafer stage 401 (through the interface 411 and 611). After the waterproof state being established, the clamping device 412 can ensure a firm connection between the wafer stage 400 and the flat board 610. The wafer stage 401 and the wafer 500 are slowly moved out of the immersion flow field. At the same time, the upper surfaces of the wafer 500, the wafer stage 401 and the flat board 610 are at the same level.

Figure 6:
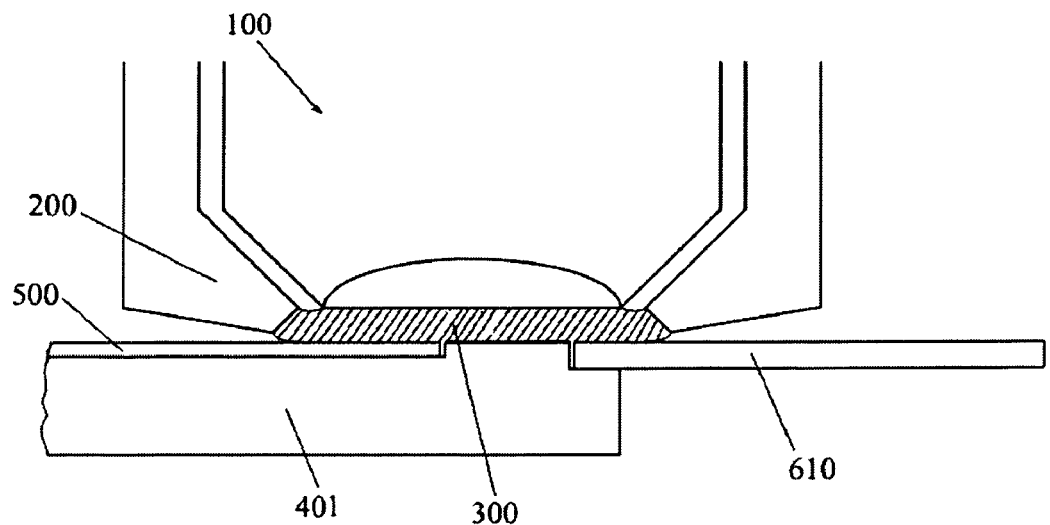
Figure 10:
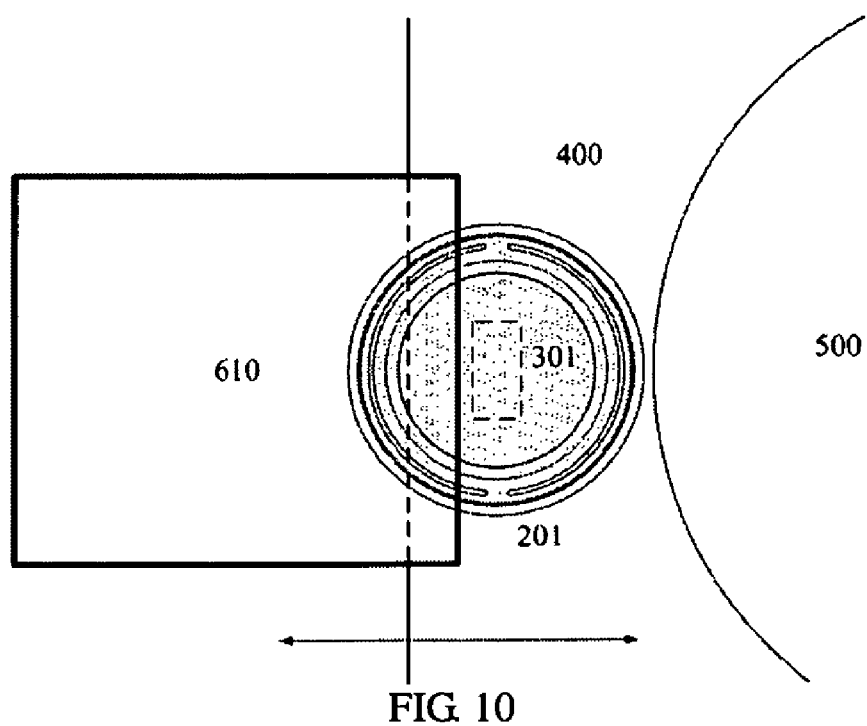
FIGS. 10 to 11 are top plan views of the position relation between the flat board and the flow field during the movement of the present immersion flow field maintenance system.

Next, as illustrated in FIG. 6, the wafer stage 401 drives the flat board 610 to move along the guideway of the flat board 610. Since the positions of the projection objective lens 100 and the immersion flow field are not changed, the flow field is transferred from the edge of the wafer 500 to above the wafer stage 401, and then transferred to above the flat board 610. FIG. 10 shows a top plan view of a state during the process that the flow field is gradually transferred from the wafer stage 401 onto the flat board 610.

Figure 7:
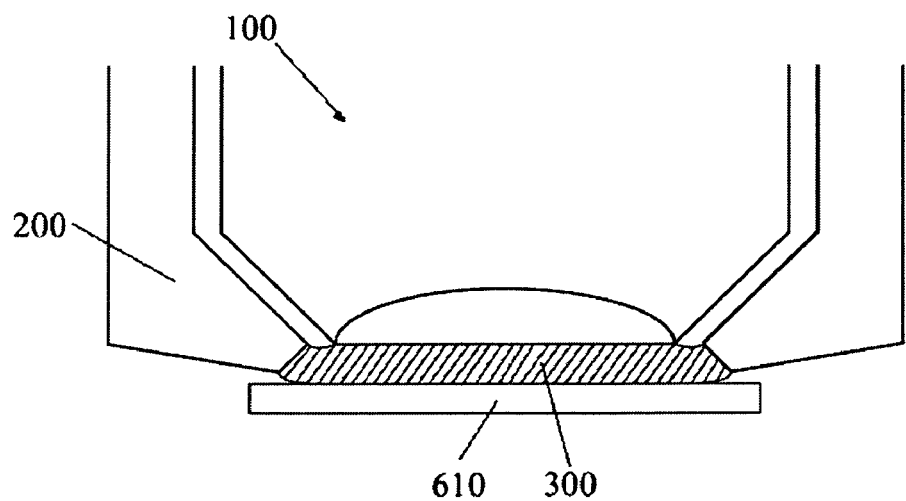
Figure 11:
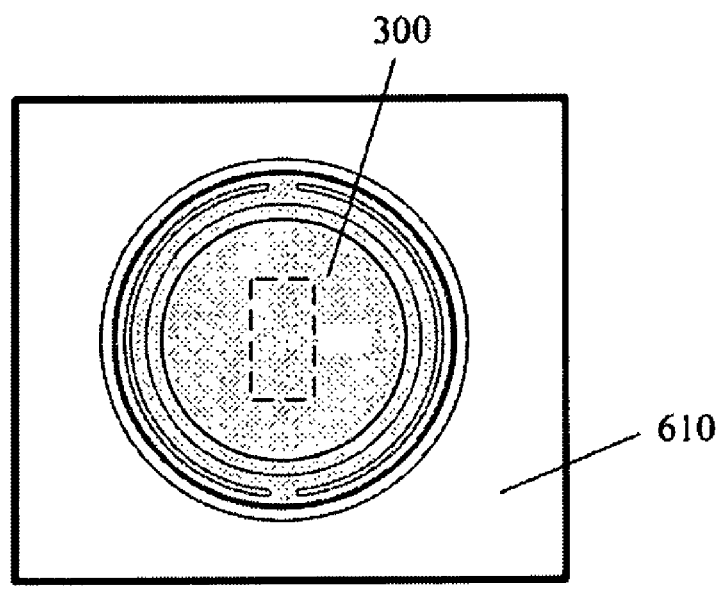

Next, as illustrated in FIG. 7, when the flow field is wholly transferred onto the flat board 610, the wafer stage 401 and the flat board 610 separate from each other. The flat board 610 is positioned right under the projection objective lens 100, thus the flow field can be maintained on the flat board 610. FIG. 11 shows a top plan view of the state that the flow field has been wholly transferred onto the flat board 610.

Thereby, the immersion flow field can carry out the establishing, maintaining and removing processes depending on the maintenance system of the present invention without the help of the wafer stage 401, thus, all the key parameters of the flow field can be measured on the flat board 610.

Figure 8:
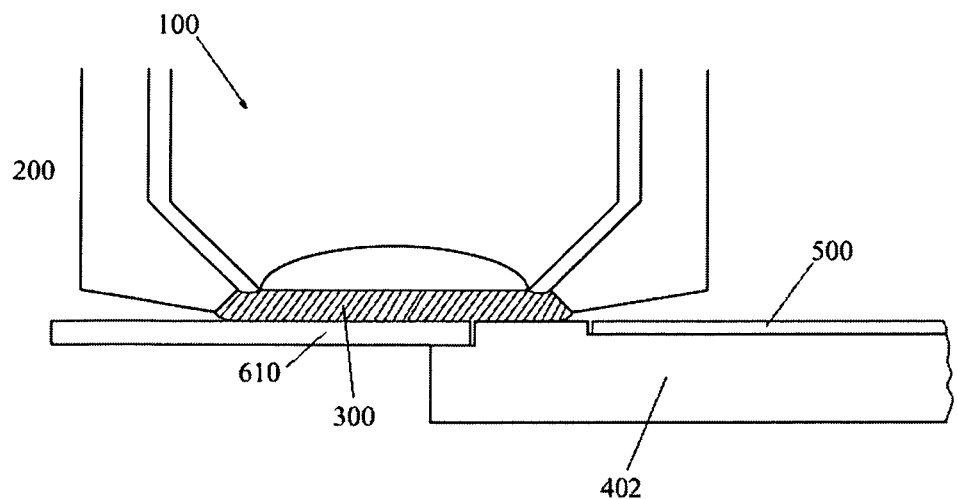

Next, as illustrated in FIG. 8, the wafer stage finishing the wafer loading, unloading and essential measurement steps enters the exposure area to carry out the transition process of the flow field. The wafer stage 402 steps to the predetermined position to connect with the flat board 610 of the immersion maintenance system. The wafer stage 402 and the flat board 610 get waterproofed via the interface devices 411 and 611, and clamped by the clamping device 412. The flat board 610 and the wafer stage 402 move synchronously, so that the flow field can be gradually transferred from the flat board 610 to the wafer stage 402.

Figure 9:
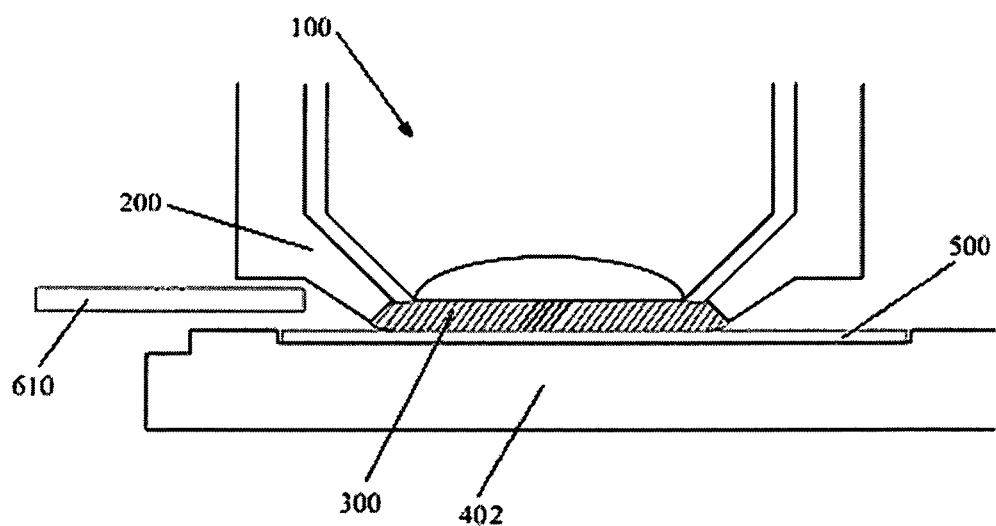

Next, as illustrated in FIG. 9, after the wafer stage 402 wholly enters the exposure area, the flat board 610 and the wafer stage 402 separate from each other. The flat board 610 moves in the horizontal direction for a distance and is raised to avoid the scan scope of the wafer stage 402 in the vertical direction. At the same time, the wafer stage 402 is located under the projection objective lens 100, and the immersion maintenance system is under a stand-to state.

When the exposure on the wafer 500 supported by the wafer stage 402 is finished, the abovementioned establishing, maintaining and removing processes of the flow field can be repeated by the wafer 500 cooperating with the flat board 610. The details will not be repeatedly described.

To sum up, the immersion flow field maintenance system of the present invention mainly provides a flat board 610 structure, which has a big enough size for supporting the whole work scope of the flow field and ensures the liquid not to leak. The wafer stage 401 (402) moves synchronously with the flat board 610 to transfer the immersion flow field from above the wafer stage 401 (402) to above the flat board 610 freely, thus enabling the switch of the position of the flow field and ensuring the flow field be continuously supported by an entity.

What should be further explained is that, when the present invention is applied to a single wafer stage lithography machine, the abovementioned wafer stages 401 and 402 represent the same wafer stage. When the present invention is applied to a dual wafer stage lithography machine, the abovementioned wafer stages 401 and 402 represent different wafer stages. The direction the wafer stage 402 entering the immersion flow field is the same as the direction the wafer stage 401 leaving the immersion flow field.

Although the preferred embodiments of the present invention are disclosed as above, technicians of this field should aware that any modification, interpolation or variation within the principle of the present invention falls in the scope of the present invention.

What is claimed is:

1. An immersion flow field maintenance system for an immersion lithography machine, the lithography machine including a projection objective lens, at least a wafer stage for supporting a wafer, and an immersion supplying system distributed around the projection objective lens for producing an immersion flow field under the projection objective lens, characterized in that the immersion maintenance system includes a horizontal guideway, a flat board connected with the horizontal guideway through a cantilever, and plural drivers for driving the flat board to move;

when the wafer is unloading and the wafer stage is moving out of the exposure area under the projection objective lens, the flat board connects to and moves synchronously with the wafer stage to transfer the immersion flow field from above the wafer stage to above the flat board;

when the wafer is loaded and the wafer stage is moving into the exposure area, the flat board connects to and moves synchronously with the wafer stage to transfer the immersion flow field from above the flat board to above the wafer stage; and when the lithography machine carries out exposure, the flat board is moved to the periphery of the projection objective lens driven by horizontal drivers and is raised over the wafer stage driven by vertical drivers without interfering with the movement of the wafer stage carrying out exposure.

2. The immersion flow field maintenance system according to claim 1, further characterized in that, the immersion flow field can be established on the flat board without supporting by the wafer stage.

3. The immersion flow field maintenance system according to claim 1, further characterized in that, the drivers include horizontal drivers attached to the horizontal guideway and driving the flat board to move in the horizontal direction, and vertical drivers attached to the cantilever and driving the flat board to move in the vertical direction.

4. The immersion flow field maintenance system according to claim 1, further characterized in that, the flat board has a hydrophobic surface the same as the surface of the wafer.

5. The immersion flow field maintenance system according to claim 1, further characterized in that, the flat board can be connected to the wafer stage via waterproof connectors.

6. The immersion flow field maintenance system according to claim 1, further characterized in that, a clamping device is disposed on the edge of the wafer stage for clamping the wafer stage and the flat board after they are connected with each other.

7. The immersion flow field maintenance system according to claim 1, further characterized in that, the horizontal guideway includes two parallel linear bearings, and the cantilever includes plural symmetrically positioned vertical cantilevers extended from opposite sides of the flat board, cantilevers of each side being connected to the horizontal guideway of the corresponding side.

8. The immersion flow field maintenance system according to claim 1, further characterized in that, the lithography machine includes one or more wafer stages, the immersion flow field switching between each wafer stage and the flat board, wherein, the direction of one wafer stage entering the immersion flow field is the same as the direction of the other wafer stage leaving the immersion flow field.

9. The immersion flow field maintenance system according to claim 8, further characterized in that, waterproof connectors are provided on both edges of the flat board and the two wafer stages.

* * * * *